United States Patent
Liu

(10) Patent No.: US 6,699,786 B2
(45) Date of Patent: Mar. 2, 2004

(54) METHOD FOR FORMING A SEMICONDUCTOR DEVICE THAT USES A LOW RESISTANCE TUNGSTEN SILICIDE LAYER WITH A STRONG ADHERENCE TO AN UNDERLAYER

(75) Inventor: Ziyuan Liu, Tokyo (JP)

(73) Assignee: NEC Electronics Corporation, Kanagawa (JP)

(*) Notice: Subject to any disclaimer, the term of this patent is extended or adjusted under 35 U.S.C. 154(b) by 0 days.

(21) Appl. No.: 10/313,290

(22) Filed: Dec. 6, 2002

(65) Prior Publication Data
US 2003/0087521 A1 May 8, 2003

Related U.S. Application Data

(62) Division of application No. 09/870,688, filed on Jun. 1, 2001, now abandoned.

(30) Foreign Application Priority Data

Jun. 2, 2000 (JP) .................................. 2000-204351

(51) Int. Cl.$^7$ ............................................. H01L 21/443
(52) U.S. Cl. .................... 438/655; 438/656; 438/683
(58) Field of Search ................................ 438/592, 649, 438/655, 656, 683

(56) References Cited

U.S. PATENT DOCUMENTS

| | | | | |
|---|---|---|---|---|
| 4,443,930 A | * | 4/1984 | Hwang et al. | 438/299 |
| 5,428,244 A | * | 6/1995 | Segawa et al. | 257/646 |
| 5,767,558 A | * | 6/1998 | Lo et al. | 257/412 |
| 6,096,630 A | * | 8/2000 | Byun et al. | 438/592 |
| 6,245,673 B1 | * | 6/2001 | Okubo et al. | 438/649 |

FOREIGN PATENT DOCUMENTS

JP  2000-150416 A  5/2000

* cited by examiner

*Primary Examiner*—Carl Whitehead, Jr.
*Assistant Examiner*—Stephen W. Smoot
(74) *Attorney, Agent, or Firm*—Foley & Lardner

(57) ABSTRACT

Tungsten silicide $WSi_x$ is grown through reduction of $WF_6$ with $SiCl_2H_2$, and the flow rate between $WF_6$ and $SiCl_2H_2$ is controlled in such a manner that the composition ratio x ranges from 2.0 to 2.2 in an initial stage for forming cores on a doped polysilicon layer, and is treated with heat at 700 degrees to 850 degrees in centigrade so as to grow tungsten silicide grains with <001> orientation faster than tungsten silicide grains with <101> orientation; the tungsten silicide $WSi_x$ is tightly adhered to the doped polysilicon, and the abnormal oxidation is restricted during the heat treatment.

12 Claims, 5 Drawing Sheets

DIFFRACTION

METHOD FOR FORMING A SEMICONDUCTOR DEVICE THAT USES A LOW RESISTANCE TUNGSTEN SILICIDE LAYER WITH A STRONG ADHERENCE TO AN UNDERLAYER

RELATED APPLICATIONS

This application is a divisional of application Ser. No. 09/870,688, filed Jun. 1, 2001, now abandoned. This application claims priority from Japanese application 2000-204351, filed Jun. 2, 2000.

FIELD OF THE INVENTION

This invention relates to tungsten silicide layer and a semiconductor device and, more particularly, to a tungsten silicide layer used as a gate electrode and a wiring strip.

DESCRIPTION OF THE RELATED ART

Tungsten silicide is attractive conductor. The tungsten silicide is much larger in conductivity than doped-polysilicon, by way of example. For this reason, the tungsten silicide is popular with semiconductor manufacturers, and is partially replaced in semiconductor devices as conductive layers such as, gate electrodes and wiring strips in order to reduce the resistance. The low-resistive tungsten silicide is conducive to the miniaturization of circuit components on semiconductor chips, and is expected to further lower the resistivity for semiconductor devices in the next generation.

In general, tungsten silicide is expressed as $WSi_x$, and the composition ratio x is usually offset from the stoichiometry at 2, i.e., $WSi_2$, because the tungsten silicide with stoichiometric composition ratio of 2 is causative of compression stress in a layer overlain by the tungsten silicide layer. The composition ratio of the order of 2.6 is popular to conductive strips in semiconductor devices, and, accordingly, the tungsten silicide for the conductive strips are expressed as $WSi_{2.6}$ as taught in Japanese Patent Publication of Unexamined Application (laid-open) No. 9-246206.

A sputtering and a chemical vapor deposition are usually used for growing the tungsten silicide. When a tungsten silicide layer is grown by using the chemical vapor deposition, a relatively small composition ratio Si/W is achieved, and low-resistive tungsten silicide $WSi_x$ is grown through the chemical vapor deposition. However, the tungsten silicide grown through the chemical vapor deposition is liable to peel from the lower layer in a thermal oxidation at a later stage of the tungsten silicide growth. The peel-off is due to abnormal oxidation at the boundary between the lower layer and the tungsten silicide layer as reported in Japan Journal of Applied Physics, 1996, vol. 35, part 1, No. 2A, pages 584 to 588 and 1999, vol. 38, part 2, No. 2B, L209 to 211.

The prior art chemical vapor deposition is carried out on the following conditions. $WF_6$ and $SiH_4$ are used as the material gases. $WF_6$ is reduced with $SiH_6$, and tungsten silicide $WSi_x$ is produced through the reduction. For this reason, the tungsten silicide $WSi_x$ contains a non-negligible amount of fluorine atom. The fluorine atoms are the cause of poor adhesion and, accordingly, the peel-off.

Another chemical vapor deposition technique has been proposed. $WF_6$ and $SiCl_2H_2$ are used in the prior art chemical vapor deposition. $WF_6$ is reduced with $SiCl_2H_2$, and $WSi_x$ is grown through the reduction. Although the resultant $WSi_x$ still contains the fluorine, the amount of fluorine is decreased by three orders of magnitude. The difference in magnitude results in large adhesion to the lower layer, and, for this reason, the tungsten silicide is usually grown through the reduction of $WF_6$ with $SiCl_2H_2$. However, if the composition ratio Si/W is still small, the tungsten silicide grown through the reduction of $WF_6$ with $SiCl_2H_2$ is still liable to peel from the lower layer due to the abnormal oxidation at the boundary.

A solution is disclosed in Japanese Patent Publication of Unexamined Application (laid-open) No. 8-153802. According to the Japanese Patent Publication of Unexamined Application, the composition ratio x equal to or greater than 2.8 is effective against the peel-off due to the abnormal oxidation. However, such a large composition ratio x renders the tungsten silicide resistive. The highly resistive tungsten silicide makes the miniaturization of wiring strips in semiconductor devices difficult. On the other hand, the tungsten silicide layers liable to peel from lower polysilicon layers are not reliable, because the peel-off gives rise to increase of resistance along the salicide structure.

SUMMARY OF THE INVENTION

It is therefore an important object of the present invention to provide a tungsten silicide layer, which exhibits small resistivity.

It is also an important object of the present invention to provide a semiconductor device, which has highly reliable conductive strips formed of the tungsten silicide layer.

It is also an important object of the present invention to provide a process for fabricating a semiconductor device, in which the tungsten silicide layer is formed at a high reproducibility.

To accomplish the object, the present invention proposes to make tungsten silicide grains with <001> orientation largest in volume ratio of all.

In accordance with one aspect of the present invention, there is provided a tungsten silicide layer incorporated in a semiconductor device, including tungsten silicide grains different in orientation having at least first tungsten silicide grains with <101> orientation and second tungsten silicide grains with <001> orientation having a volume ratio largest of all.

In accordance with another aspect of the present invention, there is provided a semiconductor device fabricated on a substrate, comprising at least one composite conductive path including a lower layer formed of silicon and an upper layer of tungsten silicide including tungsten silicide grains different in orientation and having at least first tungsten silicide grains with <101> orientation and second tungsten silicide grains with <001> orientation having a volume ratio largest of all.

In accordance with yet another aspect of the present invention, there is provided a process for fabricating a semiconductor device comprising the steps of a) preparing a substrate structure having at least a silicon layer, b) depositing a tungsten silicide on the silicon layer for producing a tungsten silicide layer, at least a part of the tungsten silicide layer at the boundary to the silicon layer being expressed as $WSi_x$ where the composition ratio x ranges from 2.0 to 2.2, and c) treating the tungsten silicide layer with heat at 700 degrees to 850 degrees in centigrade so as to render the tungsten silicide layer including plural tungsten silicide grains different in orientation and having at least first tungsten silicide grains with <101> orientation and second tungsten silicide grains with <001> orientation having a volume ratio largest of all.

BRIEF DESCRIPTION OF THE DRAWINGS

The features and advantages of the tungsten silicide layer and the semiconductor device will be more clearly understood from the following description taken in conjunction with the accompanying drawings in which.

DESCRIPTION OF THE PREFERRED EMBODIMENTS

Figure 1:
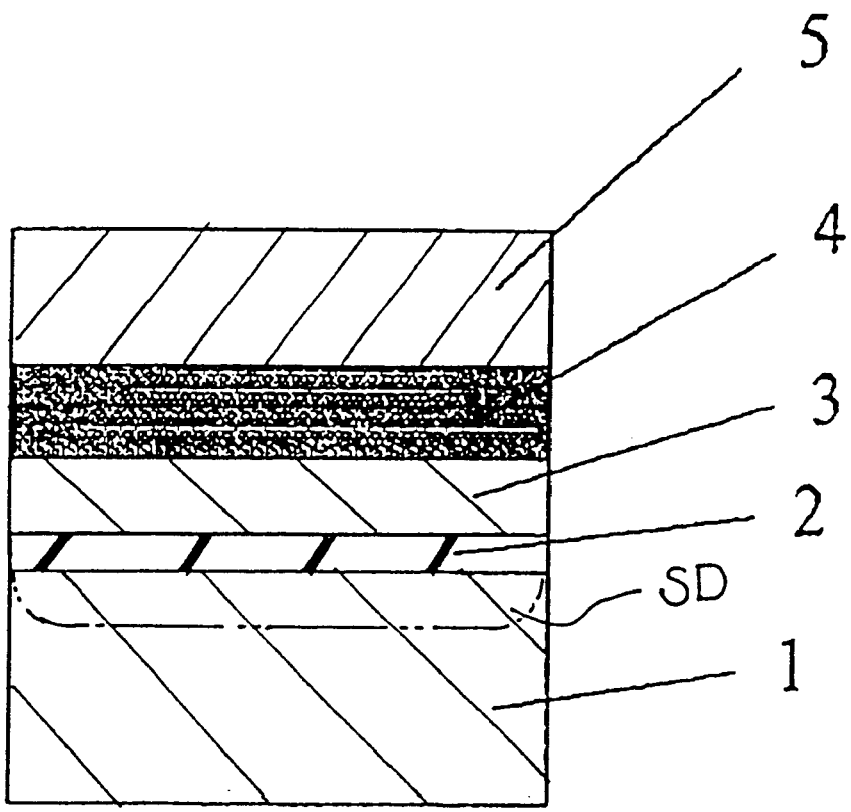
FIG. 1 is a cross sectional view showing the structure of a field effect transistor according to the present invention.

Description is made on a tungsten silicide layer embodying the present invention. The tungsten silicide layer is grown in a chemical vapor deposition system through reduction of $WF_6$ with $SiCl_2H_2$. The tungsten silicide layer is available for gate electrodes and/or conductive strips for electric current in semiconductor devices. The tungsten silicide layer may form a part of a laminated structure together with a polysilicon layer on a gate oxide layer and/or another laminated structure together with a polysilicon layer on an inter-layered insulating layer of $SiO_x$. Thus, the laminated structure of tungsten silicide/polysilicon layers serve as conductive strips for electric current.

The tungsten silicide layers are patterned as similar to the lower layers, i.e., the polysilicon layers in those applications, and serve as gate electrodes and/or the conductive paths in semiconductor devices. The adhesion between the insulating layers and the polysilicon layers is so strong that the laminated conductive paths peel less from the silicon oxide layers.

The tungsten silicide $WSi_x$ grown on the polysilicon layer contains grains with <001> orientation and grains with <101> orientation. The grains with <001> orientation are majority in the tungsten silicide $WSi_x$. In other words, the tungsten silicide grains with <001> orientation have the largest volume ratio. The ratio of grains with <101> is made to be as small as possible so that the tungsten silicide layer $WSi_x$ exhibits a large adhesion to the polysilicon layer. The large adhesion is resulted from restriction of abnormal oxidation at the boundary between the tungsten silicide layer $WSi_x$ and the polysilicon layer.

Although the layer polysilicon layer causes the stress in the tungsten silicide layer $WSi_x$ to be small, the tungsten silicide layer $WSi_x$ per se internally reduces the internal stress by virtue of the tungsten silicide grains. The tungsten silicide $WSi_x$ is much smaller in resistivity than heavily-doped polysilicon. Even if tungsten silicide layers are narrowed, the tungsten silicide layers exhibit small resistance. Thus, the tungsten silicide grains are desirable. For this reason, the tungsten silicide layers deposited on the polysilicon layers is treated with heat at 700 degrees in centigrade or higher than the temperature after the chemical vapor deposition through the reduction of $WF_6$ with $SiCl_2H_2$. The desirable temperature range is from 700 degrees to 850 degrees in centigrade. The heat treatment is carried out in non-oxidizing atmosphere such as, for example, inert gas atmosphere in order to restrict thermal oxidation. While the tungsten silicide layer is being treated with heat, the tungsten silicide grains with <001> orientation are grown faster than the tungsten silicide grains with <101> orientation. As a result, the tungsten silicide grains with <001> orientation becomes majority in the tungsten silicide layer $WSi_x$, and, accordingly, the ratio of tungsten silicide grains with <101> orientation is decreased.

The time period for the heat treatment is dependent on the temperature. The time period is to be long enough to grow the two kinds of tungsten silicide grains. However, if the heat treatment is continued too long, dopant impurity is diffused into channel regions under the gate oxide layers, and destroys the transistor characteristics. From this viewpoint, a long heat treatment is not desirable.

After an ion-implantation for introducing dopant impurity in a self-aligned manner with the gate electrode, the resultant structure is treated with heat for activation of the dopant impurity. The gate electrode has the tungsten silicide layer. If the heat treatment is carried out at 850 degrees in centigrade or lower than the temperature, the ion-implanted dopant impurity is prevented from violent thermal diffusion, and the dopant impurity remains designed profile.

Moreover, the heat treatment at 850 degrees or less prevents the source/drain electrodes from violent reaction between the surface of the semiconductor layer and the metallic electrodes. If the violent reaction takes place, the contact resistance is undesirably raised. Thus, the temperature is to be 850 degrees in centigrade or less.

The present inventor investigated an x-ray diffraction pattern of the tungsten silicide grown as described hereinbefore. The tungsten silicide grains with <001> orientation resulted in the strength $I_{002}$ at (002) peak, and the tungsten silicide grains with <101> orientation resulted in the strength $I_{101}$ at (101) peak. The $I_{101}/I_{002}$ ratio was equal to or less than 10 percent. Thus, the heat treatment achieved good selectivity.

When the tungsten silicide $WSi_x$ is grown through the reduction of $WF_6$ with $SiCl_2H_2$, it is necessary to form cores in the initial stage of the growth. The cores are obtained by controlling the flow rate $WF_6/SiCl_2H_2$. The flow rate control aims at tungsten silicide $WSi_x$ with the composition ratio x closer to the stoichiometric value between 2.0 to 2.2. As a result, stoichiometric tungsten silicide is grown at the boundary between the polysilicon and the tungsten silicide. Although the tungsten silicide close to the stoichiometry is desirable at the boundary, the composition ratio x is to be increased with time. The composition ratio x of the tungsten silicide spaced from the boundary is equal to or less than 2.6. The composition ratio x of the order of 2.4 is appropriate. While the tungsten silicide is being treated with heat after the growth, the silicon is thermally diffused from the polysilicon layer into the tungsten silicide layer, and the thermal diffusion of silicon gives rise to increase of the composition ratio x. When the thermal diffusion of silicon is taken into account, the tungsten silicide $WSi_x$ is appropriate at the boundary between the polysilicon and the tungsten silicide in the initial stage of the growth.

The tungsten silicide $WSi_x$ grown under the above-described core forming conditions are converted to tungsten silicide grains with <001> orientation at a high ratio during the heat treatment in the above-described temperature range. After the heat treatment, the tungsten silicide with <001> orientation is equal to or greater than 50 percent, and the tungsten silicide with <101> orientation is equal to or less than 10 percent. After making the Si/W composition uniform, the tungsten silicide layer $WSi_x$ has the tungsten content at relatively high, and exhibits low resistivity.

The laminated structure of polysilicon/tungsten silicide is employed in semiconductor devices embodying the present invention. In case where the laminated structure is used for the gate electrode of a field effect transistor, a polysilicon layer is overlain by a tungsten silicide layer, and the laminated structure is patterned into the gate electrode. After the patterning, silicon oxide layer is grown to 10 nanometers thick over the exposed surface of the silicon substrate through a thermal oxidation. The thin silicon oxide layer is effective against the channeling during an ion-implantation at the next stage. While the silicon is being thermally oxidized, the tungsten silicide $WSi_x$ is also exposed to the oxidation atmosphere. However, the tungsten silicide grains with <001> orientation is majority in the tungsten silicide layer, and silicon is smoothly supplied from the polysilicon. The oxidant is consumed for the reaction to SiOx. Thus, the silicon suppresses the reaction between the tungsten and oxidant, and tungsten oxide $WO_x$, especially, volatile $WO_3$ is less produced in the oxidation atmosphere. This means that the abnormal oxidation is suppressed. This results in that the tungsten silicide layer is less liable to peel from the polysilicon layer.

The semiconductor device according to the present invention is different from the prior art semiconductor device in that the above-described tungsten silicide layer forms a part of conductive paths for electric current. However, the other features are similar to those of the prior art semiconductor device. In case where the semiconductor device includes a field effect transistor, the field effect transistor has source and drain regions formed through an ion-implantation carried out in a self-aligned manner, a gate insulating layer overlain by the gate electrode formed by a polysilicon layer and the tungsten silicide layer, and the field effect transistor is covered with an inter-layered insulating layer. In case where the semiconductor device includes a multi-layered wiring structure, a lower inter-layered insulating layer, conductive paths formed by polysilicon layers and the tungsten silicide layers, an upper inter-layered insulating layer and insulating layers on the end surfaces of the tungsten silicide layers are incorporated in the semiconductor device.

A process for fabricating a semiconductor device is similar to a prior art process using the chemical vapor deposition through the reduction of $WF_6$ with $SiCl_2H_2$ except the heat treatment for selectively growing the tungsten silicide grains and the control of the Si/W composition ratio x.

Description is hereinbelow made on embodiments of the present invention with reference to the drawings.

First Embodiment

Referring to FIG. 1 of the drawings, a field effect transistor embodying the present invention is fabricated on a silicon substrate 1. A channel region is defined in a surface portion of the silicon substrate 1, and is covered with a gate oxide layer 2. Source and drain regions SD are formed in surface portions on both sides of the channel regions. Since the channel region is shown in FIG. 1, the source and drain regions SD are located over and under the sheet of paper where the field effect transistor is illustrated, and, for this reason, the source and drain regions are indicated by dos-and-dash line.

A gate electrode is formed on the gate oxide layer 2. The gate electrode has a laminated structure. Namely, a doped polysilicon layer 3 and a tungsten silicide layer 4 are laminated on the gate oxide layer 2. The tungsten silicide layer 4 is formed of the tungsten silicide with the orientation controlled as described hereinbefore. The gate electrode 3/4 is covered with a silicon oxide layer 5. The tungsten silicide used for the layer 4 contains tungsten silicide grains different in orientation. At least tungsten silicide grains with <101> orientation and tungsten silicide grains with <001> orientation are incorporated in the tungsten silicide layer 4.

Figure 2:
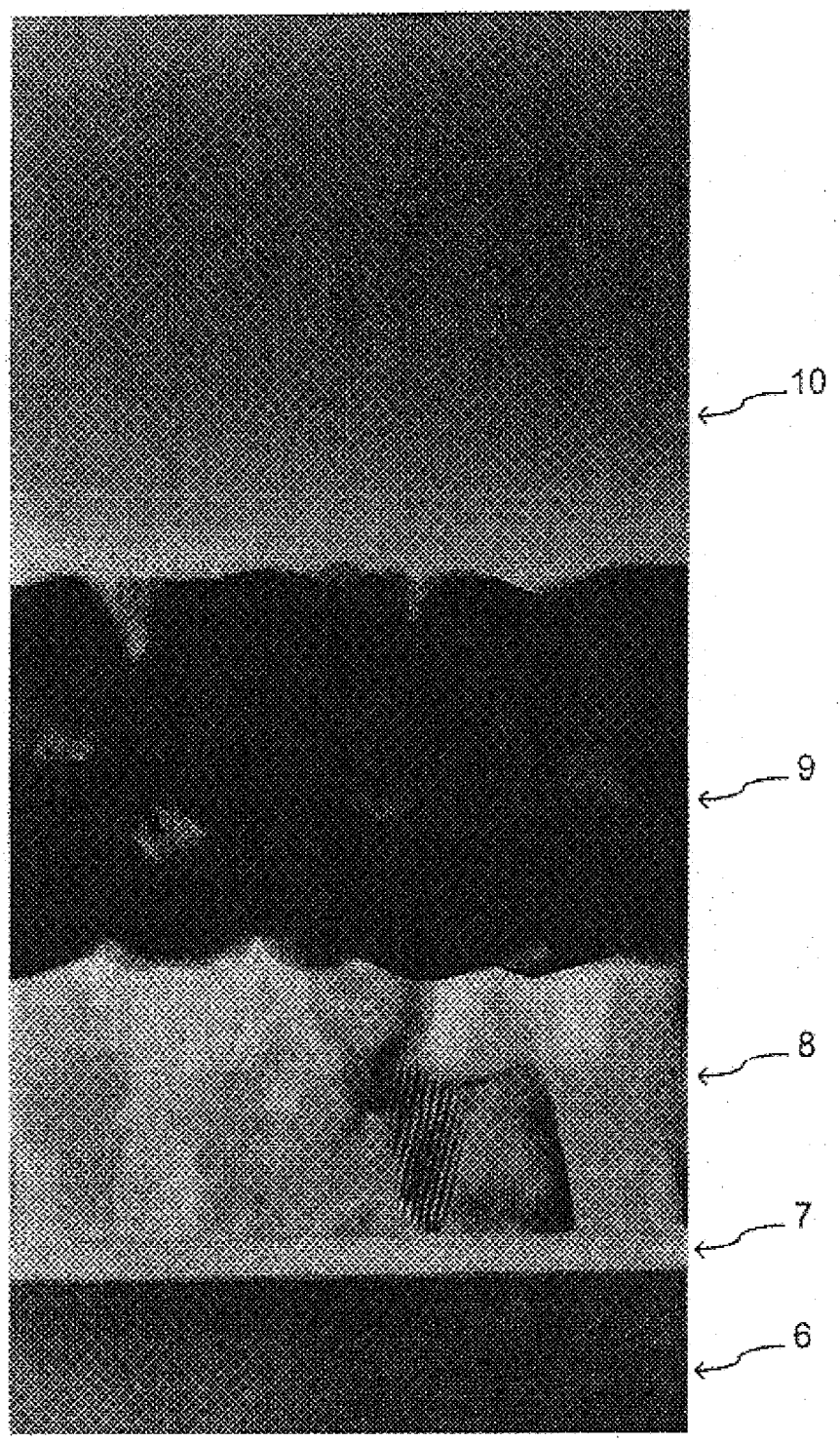
FIG. 2 is an electron microscopy photograph showing a cross section of a sample of the field effect transistor.

The present inventor observed a cross section of a sample of the field effect transistor through a transparent electron microscope, and took a photograph of the cross section shown in FIG. 2. A silicon substrate was labeled with reference numeral 6. On the silicon substrate was grown a gate oxide layer which was labeled with reference numeral 7. The gate oxide layer 7 was uniform in thickness. A doped polysilicon layer 8 was deposited on the gate oxide layer 7, and was tightly adhered to the gate oxide layer 7. On the doped polysilicon layer 8 was deposited a tungsten silicide layer 9 which was labeled with reference numeral 9. The tungsten silicide $WSi_x$ for the layer 9 contained tungsten silicide grains the orientation of which was controlled as described hereinbefore. The gate electrode 8/9 was covered with a covering layer 10 of silicon oxide. Grain boundaries were well observed in the tungsten silicide layer 9 as well as the polysilicon layer 8. The tungsten silicide grains were oriented in the particular directions. The tungsten silicide layer 9 was tightly adhered to the doped polysilicon layer 8. Any peel-off was not observed in the photograph.

In the initial stage of the chemical vapor deposition, cores were formed at the boundary between the doped polysilicon layer 8 and the tungsten silicide layer 9 through the reduction of $WF_6$ with $SiCl_2H_2$. The growth conditions were controlled such that the Si/W composition ratio x became close to the stoichiometry, i.e., and was 2.1. The tungsten silicide $WSi_x$ layer 9 was treated with heat at 850 degrees in centigrade for 20 minutes before deposition of the silicon oxide layer 10. For this reason, the tungsten silicide grains with <001> orientation were grown faster than the tungsten silicide grains with <101> orientation.

Figure 3:
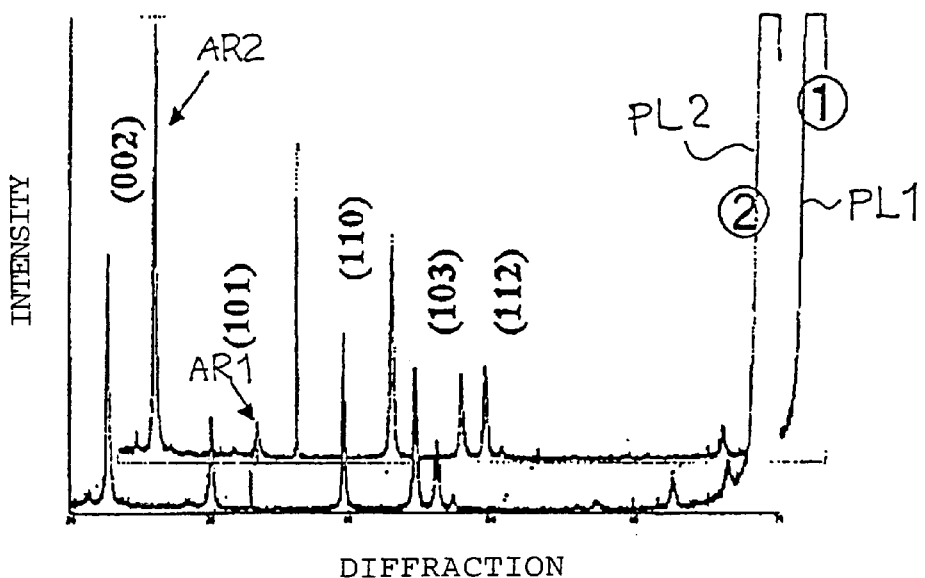
FIG. 3 is a graph showing a result of x-ray diffraction analysis on tungsten silicide according to the present invention and the prior art tungsten silicide.

The present inventor investigated the orientation of the tungsten silicide grains by using an x-ray diffraction analyzer. The diffraction analysis resulted in plots PL1 shown in FIG. 3. Plural peaks were observed in FIG. 3. The peaks were corresponding to the plural orientations of the tungsten silicide grains. In the graph shown in FIG. 3, the diffraction intensity $I_{101}$ was the minimum at (101) as indicated by arrow AR1, and the diffraction intensity $I_{002}$ was the maximum at (002) as indicated by arrow AR2. The diffraction intensity $I_{101}$ at (101) was due to the tungsten silicide grains with <101> orientation, and the diffraction intensity $I_{002}$ at (002) was due to the tungsten silicide grains with <001>. The ratio $I_{101}/I_{002}$ was 6.9 percent. Thus, the ratio of orientation was fallen within the target range of 10 percent or less.

In the prior art chemical vapor deposition, the growth conditions in the initial stage were regulated in such a manner that the Si/W composition ratio x was targeted of the order of 2.6 widely offset from the stoichiometry. The present inventor grew a tungsten silicide through the prior art chemical vapor deposition. The sample was similarly analyzed by using the x-ray diffraction analyzer. The x-ray diffraction analysis resulted in plots PL2 also shown in FIG. 3. The diffraction intensity on plots PL2 at (101) was higher than the diffraction intensity $I_{101}$ indicated by arrow AR1, and the diffraction intensity on plots PL2 at (002) was much lower than the diffraction intensity $I_{002}$ indicated by arrow AR2. From plots PL2, it was understood that the tungsten silicide grains with <101> was decreased in volume ratio and that the tungsten silicide grains with <001> orientation was increased in volume ratio. The tungsten silicide grains with <001> were not dominated in the prior art tungsten silicide layer. Thus, when the growth conditions at the initial stage was closer to the stoichiometry, the tungsten silicide grains with <001> orientation were selectively grown.

The difference in grain orientation between the prior art tungsten silicide layer and the tungsten silicide layer of the present invention resulted in the abnormal oxidation in the heat treatment carried out at the later stage. Namely, the abnormal oxidation was serious at the boundary between the doped polysilicon layer and the prior art tungsten silicide layer. On the other hand, the abnormal oxidation was well restricted at the boundary between the doped polysilicon layer and the tungsten silicide layer of the present invention. As described hereinbefore, the abnormal oxidation was causative of peel-off.

Figure 4:
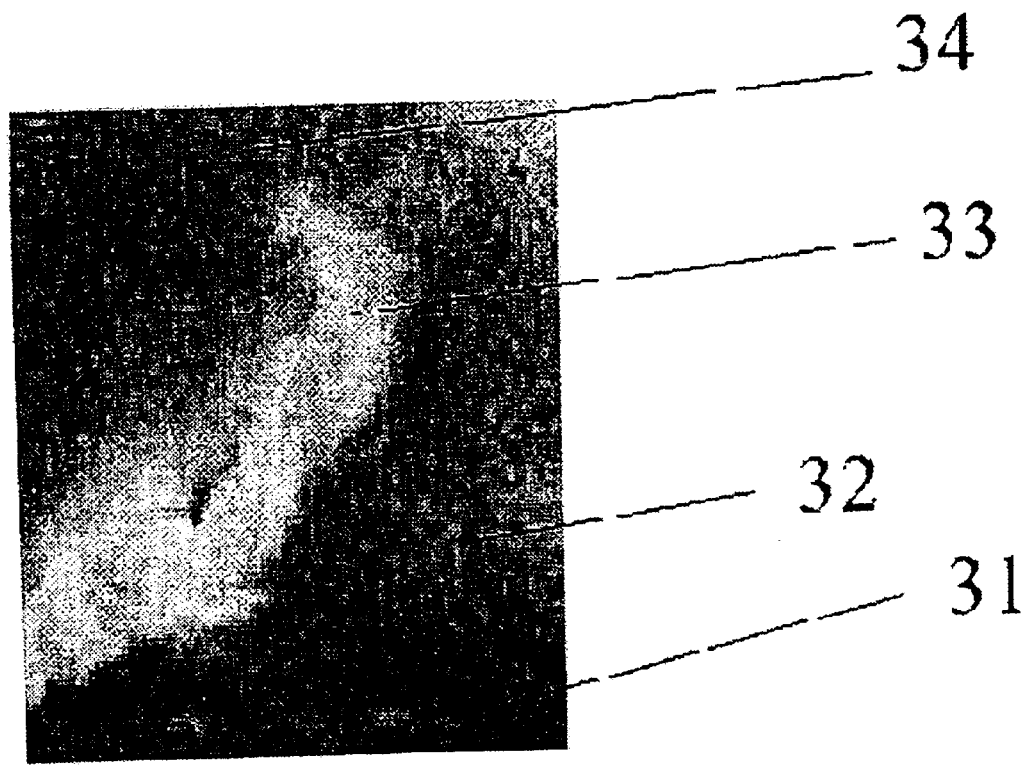
FIG. 4 is an electron microscopy photograph showing a cross section of a sample of the prior art field effect transistor.

FIG. 4 shows a photograph of a cross section of the prior art gate structure. The present inventor took the photograph through a scanning electron beam microscopy. Reference numerals 31, 32, 33 and 34 designate a doped polysilicon layer, an oxide layer of $WO_2$, $WO_3$ and $SiO_2$, a tungsten silicide layer grown through the prior art process and an oxide layer, respectively. As shown in FIG. 4, a peel-off took place at the boundary due to the oxide layer 32 grown through the abnormal oxidation. A part of the tungsten silicide layer $WSi_x$ was lost due to the peel-off so that a part of the polysilicon layer was exposed.

Figure 5:
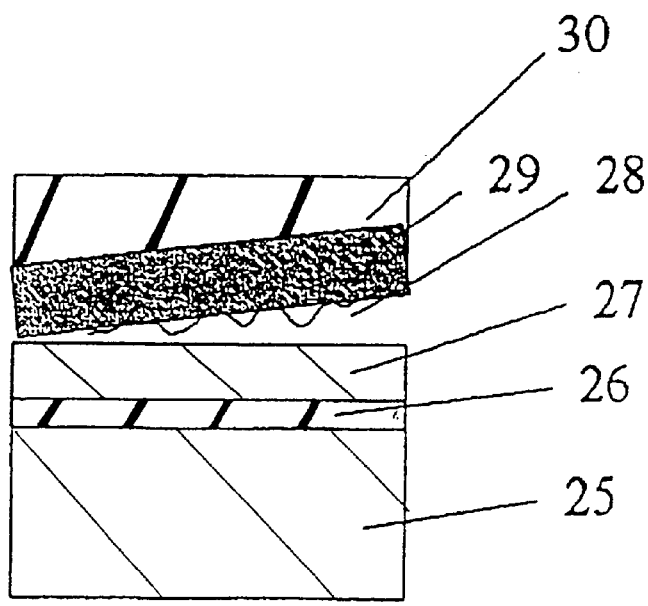
FIG. 5 is a schematic cross sectional view showing a peel-off observed between a polysilicon layer and the prior art tungsten silicide layer.

FIG. 5 schematically shows the peel-off observed in the photograph. Reference numerals 25, 26, 27, 29 and 30 designate a silicon substrate, a gate oxide layer, a doped polysilicon layer, a tungsten silicide layer and an oxide layer. The peal-off 28 takes place between the doped polysilicon layer 27 and the tungsten silicide layer 29. Since the adhesion between the gate oxide layer 26 and the doped polysilicon layer 27 is so strong that the doped polysilicon layer remains adhered to the gate oxide layer 26. The orientation of the tungsten silicide grains in the layer 29 was not controlled, and the abnormal oxidation took place during the thermal oxidation for growing the oxide layer 30. Tungsten oxide $WO_2$, $WO_3$ and silicon oxide $SiO_2$ were grown. The tungsten oxide $WO_3$ is so volatile that the peel-off 28 took place during the thermal oxidation. The tungsten silicide layer 29 lost the mechanical strength, and was partially broken. Thus, the tungsten silicide layer 29 widely peeled from the doped polysilicon layer 27.

As will be understood from the foregoing description, the tungsten silicide at the boundary to the polysilicon layer has the composition $WSi_x$ close to $WSi_2$. In other words, the composition ratio x is of the order of 2.1, and the tungsten ratio is higher than that of the tungsten silicide grown through the prior art process. The tungsten silicide grains with <001> orientation are majority over the tungsten silicide layer. These features are effective against the abnormal oxidation, and, accordingly, achieve strong adhesion to the lower polysilicon layer. For this reason, any disconnection between the polysilicon layer and the tungsten silicide layer does not take place, and the tungsten silicide exhibits low resistivity.

Second Embodiment

Figure 6:
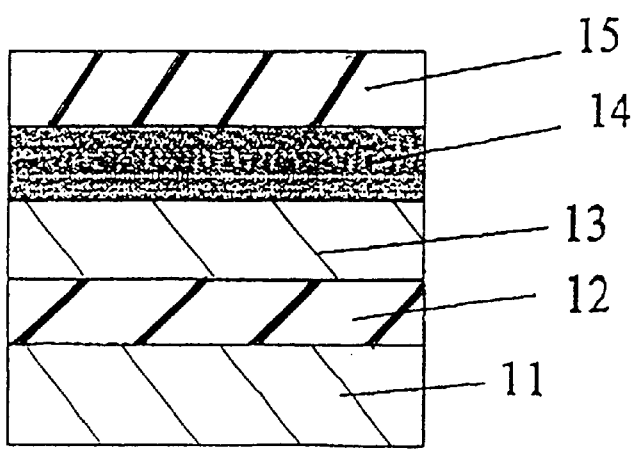
FIG. 6 is a cross sectional view showing the structure of a conductive path according to the present invention.

Turning to FIG. 6 of the drawings, a conductive path embodying the present invention has a laminated structure similar to the gate electrode of the field effect transistor implementing the first embodiment. Reference numeral 11 designates a silicon substrate. An inter-layered insulating layer 12 overlies the silicon substrate 11, and the conductive path is formed on the inter-layered insulating layer 12. A doped polysilicon 13 and a tungsten silicide layer 14, the tungsten silicide grains of which are oriented according to the present invention, form in combination the conductive path. The conductive path 13/14 is overlain by a cap layer 15 of silicon oxide.

The tungsten silicide $WSi_x$ for the layer 14 is grown through the reduction of $WF_6$ with $SiCl_2H_2$. The tungsten silicide $WSi_x$ at the boundary to the doped polysilicon layer 13 has the composition ratio x of the order of 2.1 so that the composition is close to tungsten silicide in stoichiometry. The tungsten silicide layer 14 is treated with heat around 850 degrees in centigrade for 20 minutes before the thermal oxidation for growing the cap layer 15 so that tungsten silicide grains with <001> orientation are majority over the tungsten silicide layer 14.

The present inventor fabricated the structure shown in FIG. 6, and investigated the orientation of the samples through the x-ray diffraction analysis. The ratio $I_{101}/I_{002}$ was equal to or less than 10 percent. The tungsten silicide layer 14 was strongly adhered to the doped polysilicon layer 13, and the resistivity was very low. Although the cap layer 15 was thermally oxidized, any peel-off was not observed at the boundary between the doped polysilicon layer 13 and the tungsten silicide layer 14.

As will be understood from the foregoing description, the composite conductive strip 13/14 is available for the conductive path as well as the gate electrode. The composite conductive strip 13/14 is strongly adhered to the silicon oxide layer such as, for example, the interlayer insulating layer as similar to the gate oxide layer by virtue of the doped polysilicon layer 13. The tungsten silicide layer 14 is strongly adhered to the lower polysilicon layer 13, and any peel-off does not take place at the boundary. Since the Si/W ratio x is fallen within the range for exhibiting low resistivity, the tungsten silicide layer 14 exhibits a low resistance. However, the tungsten silicide at the boundary has the Si/W composition ratio x close to the stoichiometric value 2. The tungsten silicide with the composition close to $WSi_2$ is effective against the abnormal oxidation, and keeps the tungsten silicide layer strongly adhered to the doped polysilicon layer.

Third Embodiment

Figure 7:
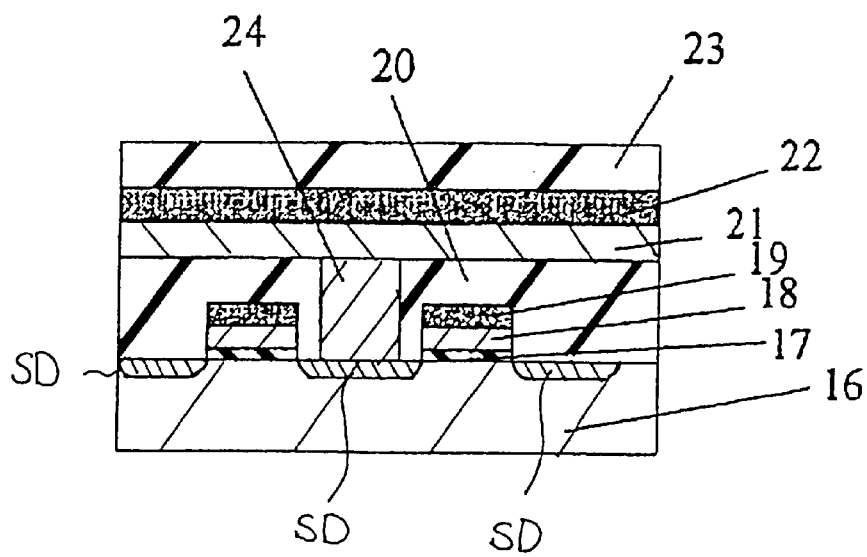
FIG. 7 is a cross sectional view showing the structure of a multiple-layered wiring structure according to the present invention.

The composite conductive strip according to the present invention is available for more than one purpose. FIG. 7 shows a semiconductor device embodying the present invention. In this instance, both of the gate electrode and the signal line have the laminated structure of doped polysilicon/tungsten silicide layers.

Reference numeral 16 designates a silicon substrate. Source/drain regions SD are formed in the silicon substrate 16 at intervals, and gate oxide layers 17 are grown on the channel regions between the source/drain regions SD. Gate electrodes 18/19 are formed on the gate oxide layers 17, and each gate electrode is implemented by a doped polysilicon layer 18 overlain by a tungsten silicide layer 19. The tungsten silicide layers 19 are grown through the process described hereinbelow, and the ratio $I_{101}/I_{002}$ is equal to or less than 10 percent.

The source/drain regions SD and the gate electrodes 18/19 are covered with a lower inter-layered insulating layer 20. A contact hole is formed in the lower inter-layered insulating layer 20, and is plugged with a conductive piece 24. The conductive plug 24 is held in contact with one of the source/drain regions SD, and is exposed to the upper surface of the lower inter layered insulating layer 20. A composite signal path is patterned on the lower inter-layered insulating layer 20, and has a doped polysilicon layer 21 and a tungsten silicide layer 22. The ratio $I_{101}/I_{002}$ is equal to or less than 10 percent. The composite signal line 21/22 is covered with an upper inter-layered insulating layer 23.

Though not shown in FIG. 7, an anti-channeling layer of silicon oxide is grown on the surface portions of the silicon substrate 16 assigned to the source/drain regions SD, and is grown to 10 nanometers thick through a thermal oxidation. While the silicon oxide is being grown, the gate electrodes 18/19 are exposed to the oxidation atmosphere. However, the abnormal oxidation is restricted at the boundary between the doped polysilicon layers 18 and the tungsten silicide layers 19, because the tungsten silicide close to the stoichiometric composition $WSi_2$ restricts the oxidation of tungsten. In other words, the tungsten oxide $WO_2$ and $WO_3$ is less liable to be produced at the boundaries. This results in that peel-off hardly takes place between the doped polysilicon layers 18 and the tungsten silicide layers 19.

The composite signal line has the features same as those of the gate electrode 18/19. For this reason, the advantages according to the present invention are also achieved. While the upper inter-layered insulating layer 23 is growing, the composite signal line 21/22 is also exposed to oxidation atmosphere. The orientation of the tungsten silicide grains in the layer 22 is also controlled so that the abnormal oxidation is restricted at the boundary between the doped-polysilicon layer 21 and the tungsten silicide layer 22. Any peel-off hardly takes place at the boundary. This results in that the tungsten silicide layer 22 is strongly adhered to the doped polysilicon layer 21.

As will be appreciated from the foregoing description, the tungsten silicide at the boundary to the polysilicon layer has the composition $WSi_x$ close to the composition $WSi_2$ in the stoichiometry, i.e., composition ratio x is 2.0 to 2.2 in the initial stage of the chemical vapor deposition, and the tungsten silicide is treated with heat at 700 degrees or higher than it before being exposed to oxidizing atmosphere. This results in that the tungsten silicide layer is dominated by the tungsten silicide grains with <001> orientation. In other words, the tungsten silicide grains with <001> orientation is majority in the tungsten silicide layer according to the present invention, and ratio of peak intensity $I_{101}/I_{002}$ is equal to or less than 10 percent. As a result, the abnormal oxidation is restricted at the boundary between the doped polysilicon and the tungsten silicide layer during the thermal oxidation. As a result, even if the composite wiring structure is exposed to the oxidizing atmosphere, the tungsten silicide layer is strongly adhered to the doped polysilicon layer. The ratio of tungsten is relatively high in the tungsten silicide layer according to the present invention, and the tungsten silicide layer with a large tungsten content exhibits a low resistivity. Thus, the composite wiring structure according to the present invention is highly reliable, and exhibits a low resistivity.

Although particular embodiments of the present invention have been shown and described, it will be apparent to those skilled in the art that various changes and modifications may be made without departing from the spirit and scope of the present invention.

For example, the silicon layer under the tungsten silicide layer may have different crystallization.

What is claimed is:

1. A process for fabricating a semiconductor device, comprising:

providing a substrate having a silicon layer;

forming a tungsten silicide layer on the silicon layer using non-inert source gases consisting of a fluorinated tungsten source gas and a chlorinated silicon source gas, at least a part of the tungsten silicide layer at the boundary with the silicon layer having a composition $WSi_x$ where x ranges from 2.0 to 2.2; and heating the tungsten silicide layer to 700 degrees to 850 degrees C. to yield a tungsten silicide layer including <001> tungsten silicide grains and <101> tungsten silicide grains, wherein the <001> tungsten silicide grains comprise a largest portion of the tungsten silicide layer.

2. The process as set forth in claim 1, further comprising exposing the tungsten silicide layer to an oxidizing atmosphere.

3. The process as set forth in claim 1, wherein the <001> grains comprise at least 50 percent of the tungsten silicide layer.

4. The process as set forth in claim 1, wherein the <101> grains comprise a smallest portion of the tungsten silicide layer.

5. The process as set forth in claim 4, wherein the <101> grains comprise no more than 10 percent of the tungsten silicide layer.

6. The process as set forth in claim 1, in which the <101> grains have an intensity peak at (101) and the <001> grains have an intensity peak at (002) in x-ray diffraction analysis, and the intensity of the (101) peak is not greater than 10 percent of the (002) peak.

7. The process as set forth in claim 1, in which the silicon layer is polycrystalline.

8. The process as set forth in claim 1, wherein the tungsten silicide layer comprises a portion of a composite conductive path.

9. The process as set forth in claim 8, wherein the composite conductive path includes the tungsten silicide layer and the silicon layer.

10. The process as set forth in claim 8, wherein the composite conductive path serves as a gate electrode of a field effect transistor.

11. The process as set forth in claim 8, in which the composite conductive path serves as a signal propagation path.

12. The process as set forth in claim 1, wherein the silicide layer is formed by reduction of $WF_6$ and $SiCl_2H_2$.

* * * * *